US005898292A

United States Patent [19]
Takemoto et al.

[11] Patent Number: 5,898,292
[45] Date of Patent: Apr. 27, 1999

[54] PROCESS FOR EVALUATING REMAINING CAPACITY OF BATTERY

[75] Inventors: Hideharu Takemoto; Hiroya Umeyama; Kenji Watanabe, all of Saitama, Japan

[73] Assignee: Honda Giken Kogyo Kabushiki Kaisha, Tokyo, Japan

[21] Appl. No.: 08/853,219

[22] Filed: May 9, 1997

[30] Foreign Application Priority Data

May 9, 1996 [JP] Japan ................. 8-114874

[51] Int. Cl.$^6$ ................. H02J 7/00; G01N 27/416
[52] U.S. Cl. ................. 320/136; 324/427; 429/92
[58] Field of Search ................. 320/132, 134, 320/135, 136, 148, 161; 324/429, 427; 429/92

[56] References Cited

U.S. PATENT DOCUMENTS

| | | | |
|---|---|---|---|
| 5,635,842 | 6/1997 | Yokoo et al. | 324/427 |
| 5,703,469 | 12/1997 | Kinoshita | 340/636 |
| 5,744,931 | 4/1998 | Arai et al. | 320/149 |
| 5,789,923 | 8/1998 | Shimoyama et al. | 324/427 |
| 5,793,211 | 8/1998 | Shimoyama | 324/427 |

FOREIGN PATENT DOCUMENTS

| | | |
|---|---|---|
| 1-39069 | 8/1989 | Japan. |
| 7-20216 | 1/1995 | Japan. |

*Primary Examiner*—Peter S. Wong
*Assistant Examiner*—Gregory J. Toatley, Jr.
*Attorney, Agent, or Firm*—Lyon & Lyon LLP

[57] ABSTRACT

A process for evaluating a remaining capacity of a battery includes the steps of measuring a discharge current and output voltage from the battery during discharging of the battery, calculating a maximum output value of the battery based on a characteristic of the variation in discharge current and output voltage determined from the measured values of the discharge current and output voltage, and evaluating the remaining capacity of the battery based on the calculated maximum output value. The evaluation of the remaining capacity of the battery by this process is prohibited in a sudden-load-varying state in which the variation in load of the battery during discharging of the battery exceeds a predetermined limit level. Thus, it is possible to properly evaluate the remaining capacity of the battery without obtaining or using unstable voltage information of the battery immediately after the load varies suddenly, thereby leading to an enhanced accuracy of evaluation of the remaining capacity.

12 Claims, 6 Drawing Sheets

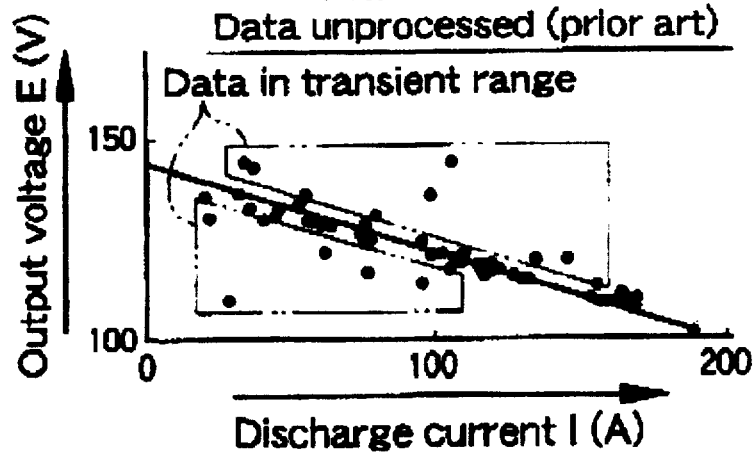
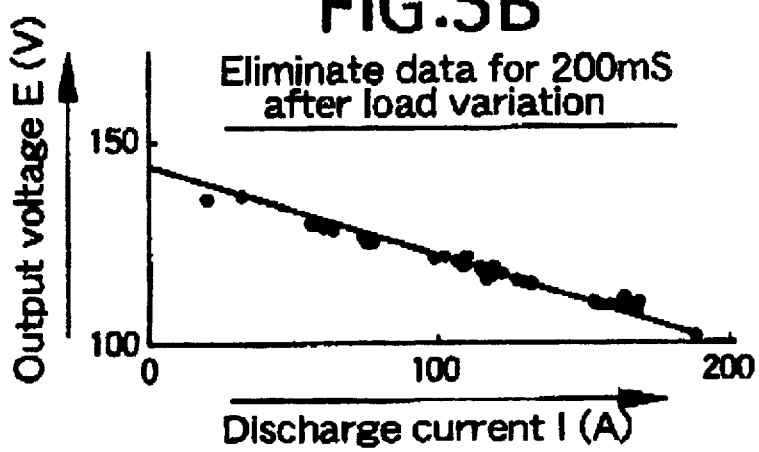
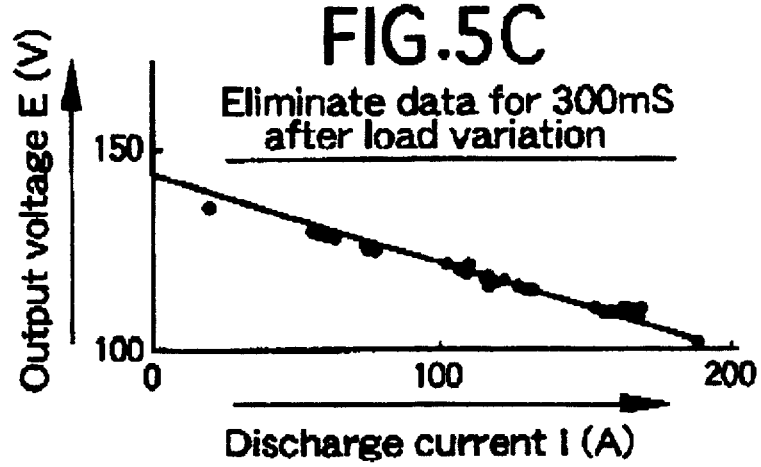

PROCESS FOR EVALUATING REMAINING CAPACITY OF BATTERY

FIELD OF THE INVENTION

The present invention relates to a process for evaluating a remaining capacity of a battery, which process is preferred for evaluating at a real time the remaining capacity of the battery, particularly, any secondary (or storage) battery such as a lead accumulator battery, a nickel-cadmium battery, a lithium ion battery and the like that can be used and recharged repeatedly.

DESCRIPTION OF THE RELATED ART

One example of a known remaining-capacity evaluating process used in a battery remaining-capacity meter is a maximum output evaluating process conceived in view of the fact that the discharging characteristic, i.e., the current-voltage characteristic during discharging of the battery varies in accordance with the remaining capacity of the battery. This process is intended to evaluate an actual remaining capacity of the battery by measuring a discharge current and an output voltage from the battery corresponding to the load varied during discharging of the battery, calculating a relational expression of current-voltage characteristic based on the measured discharge current and output voltage (in general, the current-voltage characteristic L will be approximately a linear functional expression wherein the output voltage decreases substantially rectilinearly in accordance with an increase in discharge current, as shown in FIG. 1), thereby calculating a maximum output value $P_{max}$ of the battery from the relational expression, and correlating the calculated maximum output value $P_{max}$ with a map of correlation between the maximum output value and the remaining capacity, which map is experimentally made in advance.

The related art techniques such as a maximum output evaluating process are disclosed, for example, in Japanese Patent Publication No. 1-39069 and Japanese Patent Laid-open No. 7-20216 (the corresponding U.S. patent application is Ser. No. 08/269,404 which is hereby incorporated by reference).

In the known maximum output evaluating process, however, it is not taken into consideration in any way that the output voltage of the battery during discharging of the battery is stabilized after passing through a transient varied state in response to a sudden variation in load. Namely, the output voltage E of the battery is not stabilized immediately after the sudden variation in load, for example, as shown in FIG. 2. This is a cause for increasing the dispersion in obtaining the above-described relational expression of discharge current and output voltage (current-voltage characteristic) (for example, see a degree of dispersion of data in FIG. 5A). Therefore, the accuracy of the calculation of the maximum output value $P_{max}$ calculated from the relational expression reduces correspondingly and in turn, the accuracy of evaluation of the remaining capacity reduces.

Particularly, in a discharging range in which the load on the battery is relatively low, a long time is required until the output voltage of the battery is stabilized immediately after a sudden variation in load, as compared with a case in a discharging range in which the load on the battery is relatively high. This also influences the variability and the accuracy.

In a case where the load variation rate of the battery is relatively large, a long time is required for stabilizing the output voltage immediately after a sudden variation in load, as compared with a case where the load variation rate of the battery is relatively small. This also influences the dispersion and the accuracy.

In general, the ability of the battery to absorb a sudden variation in load tends to decrease, as the remaining capacity of the battery decreases. For this reason, in determining whether the battery is in a sudden load-varying state, it is desirable to change the limit level of load variation (e.g., the limit variation rate) which is a criterion of the determination, in accordance with the remaining capacity of the battery.

SUMMARY OF THE INVENTION

Accordingly, it is an object of the present invention to provide a process for evaluating a remaining capacity of a battery, wherein the above-described problems can be solved.

To achieve the above object, according to a first aspect and feature of the present invention, there is provided a process for evaluating a remaining capacity of a battery, comprising the steps of measuring a discharge current and an output voltage from the battery during discharging of the battery, calculating a maximum output value of the battery based on the characteristic of variation in discharge current and output voltage obtained from the measured values, and evaluating a remaining capacity of the battery from the calculated maximum output value, wherein the evaluation of the remaining capacity is prohibited in a sudden load-varied state in which the variation in load of the battery during discharging of the battery exceeds a predetermined limit level.

With such first feature of the present invention, it is possible to evaluate a remaining capacity of the battery without obtaining or using unstable information (i.e., a transient variation in output voltage) of the battery immediately after a sudden variation in load, leading to an enhanced accuracy of the evaluation of the remaining capacity. Therefore, a remaining-capacity meter having a high detection accuracy can be provided.

According to a second aspect and feature of the present invention, in addition to the first feature, even if the sudden-load-varying state is eliminated, the evaluation of the remaining capacity is prohibited for a period until a predetermined time lapses from the sudden-load-varying state.

With the second feature of the present invention, an evaluation prohibiting period can be determined in consideration of the time required for stabilizing the battery voltage immediately after the sudden variation in load. Therefore, it is possible to detect voltage data of a narrow dispersion to contribute to an enhancement in accuracy of the evaluation of the remaining capacity.

According to a third aspect and feature of the present invention, in addition to the second feature, the predetermined prohibiting time is determined in accordance with the level of the battery load.

With the third feature of the present invention, because the predetermined prohibiting time is set according to the level of the battery load, even if the time required for stabilizing the output voltage from the battery immediately after the variation in load changes depending upon the level of the load, the predetermined prohibiting time can be changed in accordance with the level of the load. Therefore, it is possible to perform the evaluation of the remaining capacity with a high accuracy without being influenced by the level of the load.

According to a fourth aspect and feature of the present invention, in addition to the second or third feature, the predetermined prohibiting time is determined in accordance with a rate of variation in load on the battery.

With the fourth feature of the present invention, because the predetermined prohibiting time is set according to the load variation rate on the battery, even if the time required for stabilizing the output voltage from the battery immediately after the variation in load changes depends upon the load variation rate, the predetermined prohibiting time can be changed in accordance with the load variation rate. Therefore, it is possible to perform the evaluation of the remaining capacity with a high accuracy without being influenced by the load variation rate.

According to a fifth aspect and feature of the present invention, in addition to any of the first, second, third and fourth features, the limit level is determined in accordance with the remaining capacity of the battery.

With the fifth feature of the present invention, because the limit level of the variation in load which is a criterion for judging whether a state is the sudden-load-varying state is set according to the remaining capacity of the battery, the limit level of the variation in load can be changed depending upon the battery load absorbing ability varied in accordance with the remaining capacity of the battery. Therefore, it is possible to efficiently collect voltage data required for the evaluation of the remaining capacity without obtaining or using unnecessary voltage data which reduces the accuracy of evaluation of the remaining capacity. This can contribute to an enhancement in accuracy of the evaluation of the remaining capacity.

The above and other objects, features and advantages of the invention will become apparent from the following description of the preferred embodiments taken in conjunction with the accompanying drawings.

BRIEF DESCRIPTION OF THE DRAWINGS

FIGS. 5A, 5B and 5C are graphs illustrating current-voltage variation characteristics calculated from measured data during discharging of the battery in a prior art process and in first and second embodiments of the process according to the present invention, respectively;

DETAILED DESCRIPTION OF THE PREFERRED EMBODIMENTS

The present invention will now be described by way of preferred embodiments with reference to the accompanying drawings.

First, one example of a remaining-capacity evaluating process (a maximum-output evaluating process) will be described which is used in a meter for evaluating a remaining capacity of a secondary battery mounted in a conventional vehicle or an electric vehicle.

Figure 1:
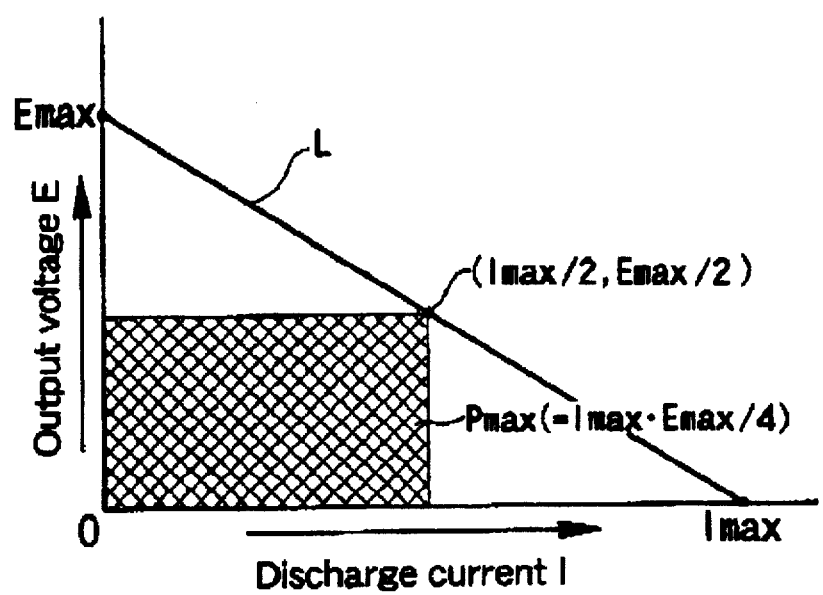
FIG. 1 is a graph illustrating one example of a current-voltage variation characteristic during dis-charging of a battery.

This process includes a step of measuring a plurality of sets of discharge current I and output voltage E from the secondary battery at suitable intervals during discharging of the secondary battery, and a step of mathematically operating a primary recursive expression representing the current-voltage characteristic by using a conventionally known mathematical technique and each set of these measured values (this expression is a primary functional expression corresponding to a straight line L passing through plotted measurement points in a graph showing the electric current I taken in the horizontal axis and the voltage E taken in the vertical axis as shown in FIG. 1), calculating a maximum value $I_{max}$ of discharge current (a current value at the time when the output voltage E is "0" in the expression) and a maximum value $E_{max}$ of output voltage (the discharge current I is "0" in the expression) from the expression, and calculating a maximum output value $P_{max}$ of the battery (which is equal to $1_{max} \cdot E_{max}/4$ and corresponds to an area of the hatched portion in the graph shown in FIG. 1) from the calculated maximum values $I_{max}$ and $E_{max}$, thereby evaluating a depth of discharge DOD, i.e., a remaining capacity of the secondary battery from the calculated maximum output value $P_{max}$. At the mathematically operating step, the evaluation of an actual remaining capacity of the secondary battery is performed by correlating the calculated maximum output value $P_{max}$ with a map previously and experimentally made which illustrates the correlation between the maximum output value and the remaining capacity.

A conventionally known computer is used for carrying out the mathematical processing step. More specifically, the computer incorporated in a remaining-capacity meter (not shown) carries out the mathematical operation according to a predetermined program, thereby automatically outputting a signal corresponding to the evaluated value of a remaining capacity of the secondary battery from a plurality of sets of measured values of discharge current I and output voltage E. The display of the remaining capacity in the remaining-capacity meter is performed in correspondence to such output signal. If required, the output signal may be delivered to a charger, a prime mover for driving the charger, and other devices to control these devices.

The outline of the above-described remaining-capacity evaluating process (maximum output evaluating process) is conventionally known. The detail of this process is also disclosed in the above-described prior art technical documents, including U.S. application Ser. No. 08/269,404 that is incorporated by reference, and hence, the further description thereof here is omitted.

Figure 2:
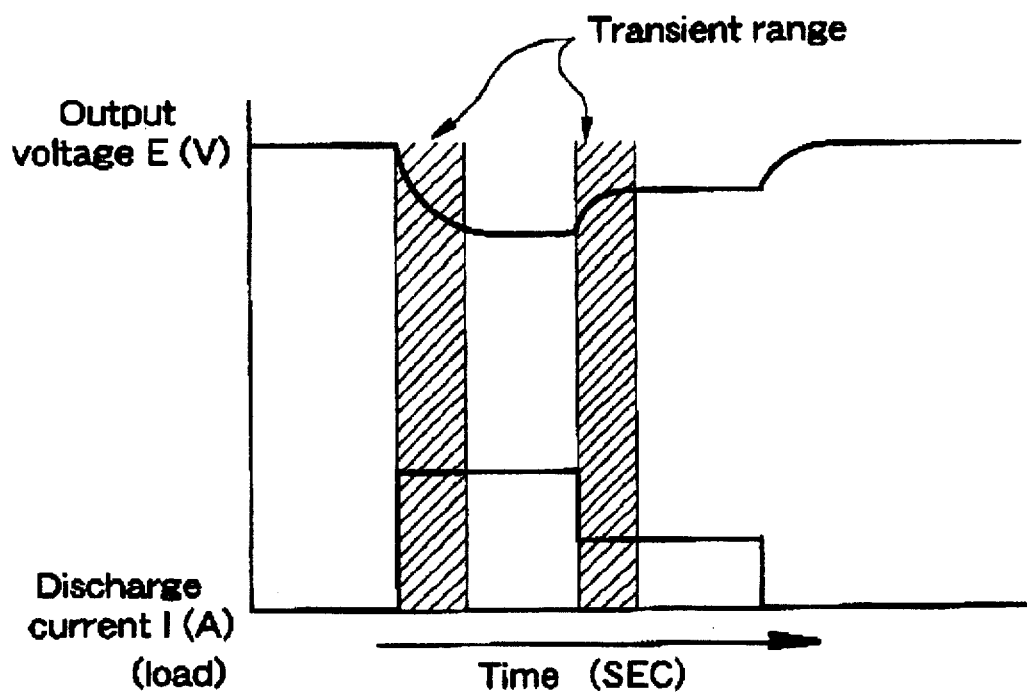
FIG. 2 is a graph illustrating one example of a variation in battery voltage with the passage of time with respect to a sudden variation in load.

In such a conventional maximum output evaluating process, a phenomenon of the voltage outputted from the battery during discharging being stabilized with respect to a sudden variation in load after passing through a transiently varying state is not taken into consideration in any way. That is, the output voltage E from the battery is not stabilized immediately after the sudden variation in load, such as shown in FIG. 2. This is an essential cause for an increase in dispersion in determining the expression of correlation between the discharged current I and the output voltage E (current-voltage characteristic), and in turn, for reduction in the accuracy of evaluation of the remaining capacity.

Figure 3:
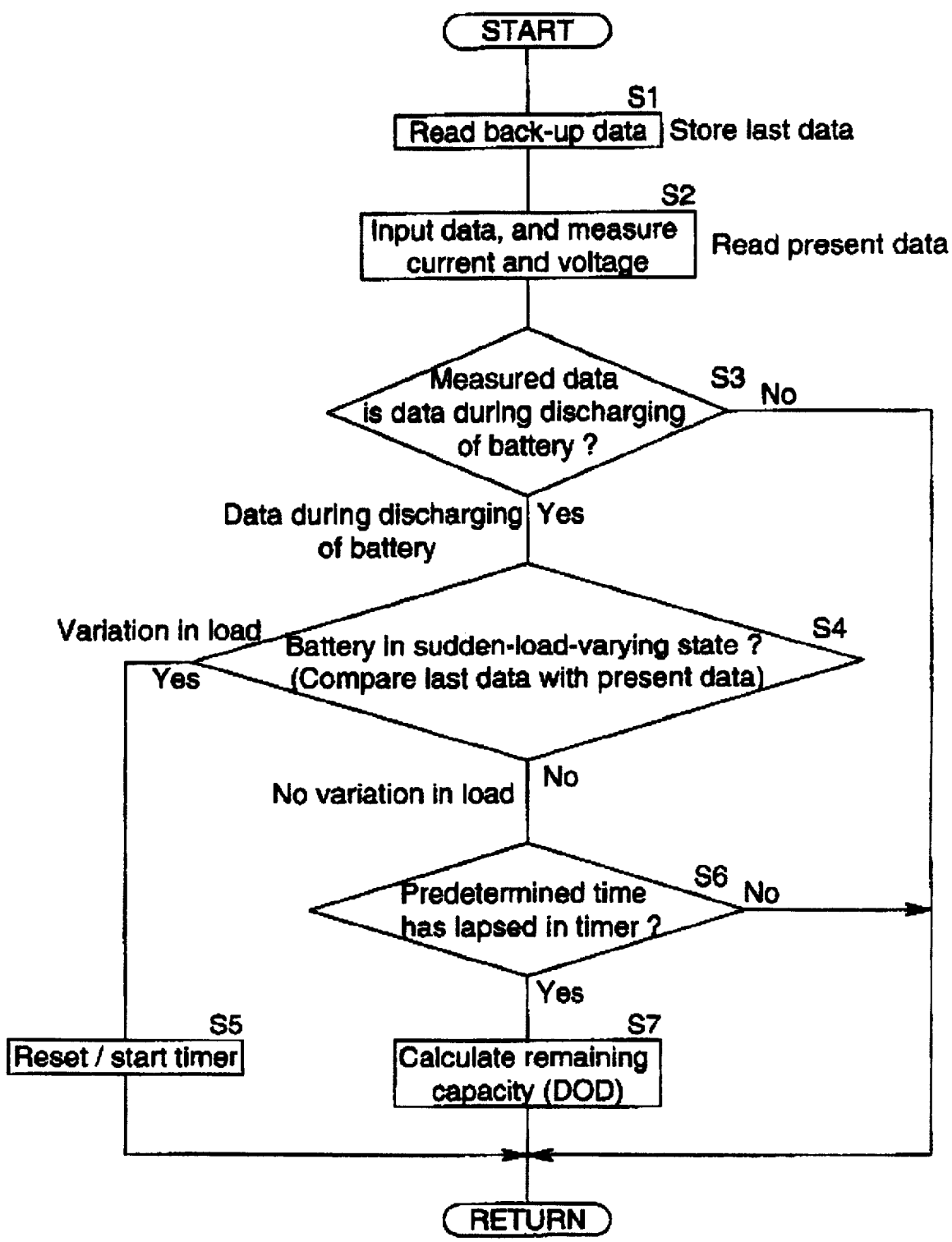
FIG. 3 is a flow chart illustrating an essential portion of an embodiment of a remaining-capacity evaluating process according to the present invention.

In the remaining-capacity evaluating process according to the present invention, in order to solve such a problem, the evaluation of the remaining capacity is prohibited in a sudden-load-varying state in which the variation in load of the battery during discharging exceeds a predetermined limit level. In carrying out the present invention, a processing procedure, for example, as illustrated in a flow chart in FIG. 3, is employed.

More specifically, at step S1, measured data of the last discharge current I and output voltage E stored as back-up data are read. At step S2, the present discharge current I and output voltage E are measured, and that measured data are read as data for this time or cycle. At step S3, it is judged whether the data read this time is data during discharging of the battery. If the data is not data during discharging of the battery, the processing returns to START. If the data is data during discharging of the battery, the processing proceeds to step S4. At step S4, it is judged whether the battery is in a sudden-load-varying state in which the variation in load exceeds a predetermined limit level (a predetermined limit variation rate in the illustrated embodiment). If it is judged that the battery is in the sudden-load-varying state, a timer is reset and then started to be operated (i.e., started to count the time) at step S5, thereafter returning to START. On the other hand, if it is judged that the battery is not in the sudden-load-varying state, the processing proceeds to step S6, at which it is judged whether a predetermined prohibiting time T set by the timer has lapsed. If the time T has not lapsed, the processing returns to START. If the time T has lapsed, the processing for a series of evaluation of remaining-capacity values described above in detail is carried out at step S7, and then, the processing returns to START.

The processing procedure as described above is carried out repeatedly at extremely short time intervals to evaluate a remaining capacity of the secondary battery.

In this embodiment, only the data during discharging of the battery (during assisting) is used for the evaluation of the remaining capacity at step S3. Therefore, data during regenerative operation and during charging of the battery in cruising are eliminated from evaluating data and hence, the process according to the present invention can be used without any problem not only in a conventional vehicle and an electric vehicle, but also in a so-called hybrid vehicle.

At step S4, it is judged whether the variation in load of the battery exceeds the predetermined limit level (the limit variation rate in the illustrated embodiment), by judging whether the variation rate per unit of time in battery output P (=I·E and being synonymous with the electric power) varying in accordance with the battery load, i.e., the output variation rate $\Delta P$ (=$\Delta I \cdot \Delta E$) exceeds a predetermined limit variation rate $\Delta P_x$ previously determined. However, in place of this technique, it may be judged whether the variation in load of the battery exceeds the predetermined limit level, by judging whether the variation rate per unit of time in only the discharge current I varying in accordance with the battery load, i.e., the current variation rate $\Delta I$ exceeds a predetermined limit variation rate $\Delta I_x$ previously determined. It is judged by the timer whether the predetermined prohibiting time has lapsed at step S6, and this predetermined prohibiting time T is previously set in consideration of a time required for stabilizing the battery voltage E immediately after a sudden variation in load. This set value may be fixed at a given value to simplify the circuit, or may be varying amount of time depending upon the level and variation rate of the battery load, as described later.

Thus, if it is judged at step S4 that the battery is in the sudden-load-varying state, the processing proceeds to step S5, whereby the evaluation of the remaining capacity at step S7 is not carried out. Therefore, the remaining capacity of the battery can be properly evaluated without obtaining or using unstable information (i.e., the transient variation in output voltage E) of the battery immediately after such a sudden variation in load, thereby leading to an enhanced accuracy of evaluation.

Even when the sudden-load-varying state is eliminated, it is judged at step S6 whether the predetermined prohibiting time T has lapsed from the sudden-load-varying state, and the prohibition of the evaluation of the remaining capacity at step S7 continues until the predetermined prohibiting time T lapses. By setting such a predetermined prohibiting time T, an evaluation prohibiting time can be determined in consideration of the time required for stabilizing the battery voltage E immediately after the sudden variation in load. Therefore, voltage data of a narrow dispersion can be detected to further enhance accuracy of evaluation of the remaining capacity.

Figure 4:
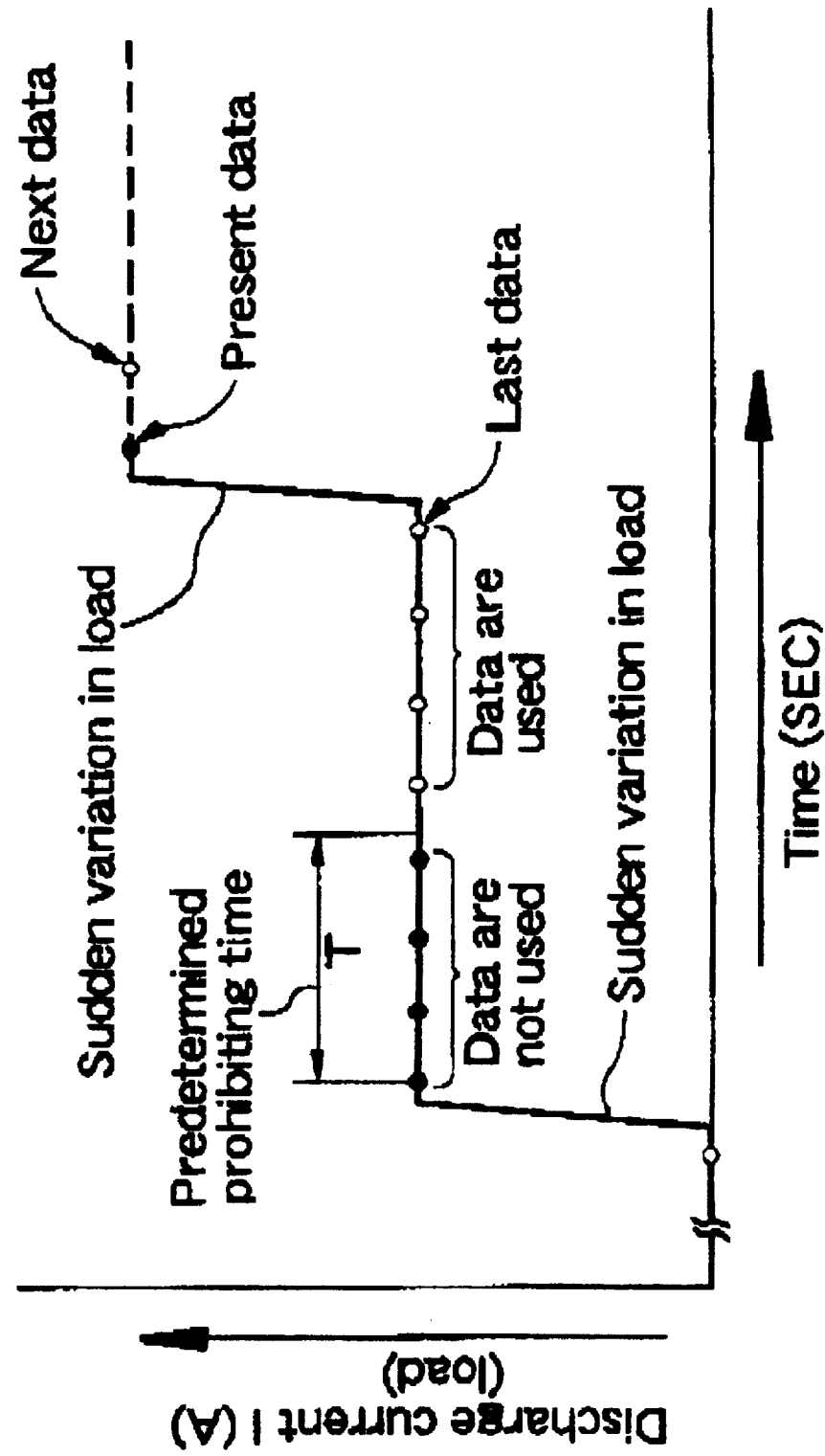
FIG. 4 is a schematic diagram illustrating the handling of data in each cycle of the flow chart.

For a better understanding of the method of dealing with such data, one example of the employment or rejection of data at the time when the load varies suddenly is shown in FIG. 4. In FIG. 4, current-voltage data (shown by black dots in FIG. 4) taken in a period until the predetermined prohibiting time lapses from the recognition of the sudden-load-varying state identified by a sudden variation in discharge current I is eliminated, because it is unnecessary data with a wide dispersion, and data (shown by white dots in FIG. 4) taken in a period after lapse of the predetermined prohibiting time T until a next occurrence of sudden variation in load, is used for evaluation as necessary data. For example, in FIG. 4, it is recognized that the battery is in the sudden-load-varying state, by comparison of the "last data" immediately before variation in load, i.e., the back-up data (read in step S1 in FIG. 3) with the "present data" (read in step S2). The present data is backed-up (stored) for comparison with the "next data". The "last data" is stored because it is used for evaluation of a depth of discharge, i.e., a remaining capacity, and the "present data" is eliminated after being compared with the "next detected data", because it is data with a wide dispersion immediately after the sudden variation in load.

To compare and verify degrees of dispersion in measured data of current-voltage measured in an actual vehicle, the current-voltage variation characteristics calculated from measured data during discharging of the battery in a prior art process (when all of data immediately after the sudden variation in load is used for evaluation of a remaining capacity) is shown in FIG. 5A, in a first embodiment of the process according to the present invention (when data detected in a period until the predetermined prohibiting time of 200 mS has lapsed after a sudden variation in load is eliminated) is shown in FIG. 5B, and in a second embodiment of the process according to the present invention (when data detected in a period until a predetermined prohibiting time of 300 mS has lapsed after the sudden variation in load is eliminated) is shown in FIG. 5C. It is evident from comparison of this data that the dispersion of the voltage data is wider in the conventional process shown in FIG. 5A. Thus, by carrying out the examples of the process according to the present invention shown in FIGS. 5B and 5C, voltage data with a narrow dispersion can be detected to calculate the linear expression of the current-voltage characteristic and in turn, the maximum output value $P_{max}$ of the battery with a good accuracy.

Figure 6:
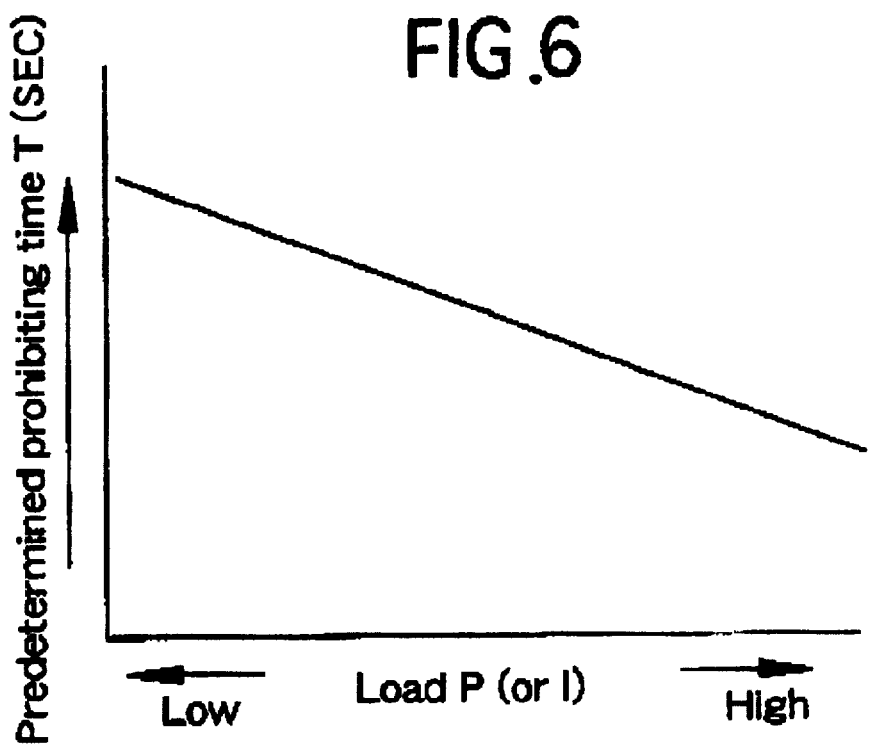
FIG. 6 is a map illustrating one example of a predetermined prohibiting time determined in accordance with the level of a load (battery output or current)

In a range of a relatively low load on the battery, a long time is required until the output voltage from the battery is stabilized immediately after the load varies, as compared with a case in a range of a relatively high load on the battery. This also influences the dispersion and the accuracy. Therefore, when the predetermined prohibiting time T is variably determined so that it can vary in accordance with the level of the battery output P or discharged current I as the battery load (so that the predetermined prohibiting time T is prolonged, as the battery output P or discharged current I decreases in the illustrated example), as shown in FIG. 6, the predetermined prohibiting time T can be changed in accordance with the level of the load, even if the time required until the output voltage E from the battery is stabilized immediately after a sudden variation in load varies depending upon the level of the load (the battery output P or discharged current I). Thus, it is possible to perform the evaluation of a remaining capacity with a high degree of accuracy without being influenced by the level of the load.

Figure 7:
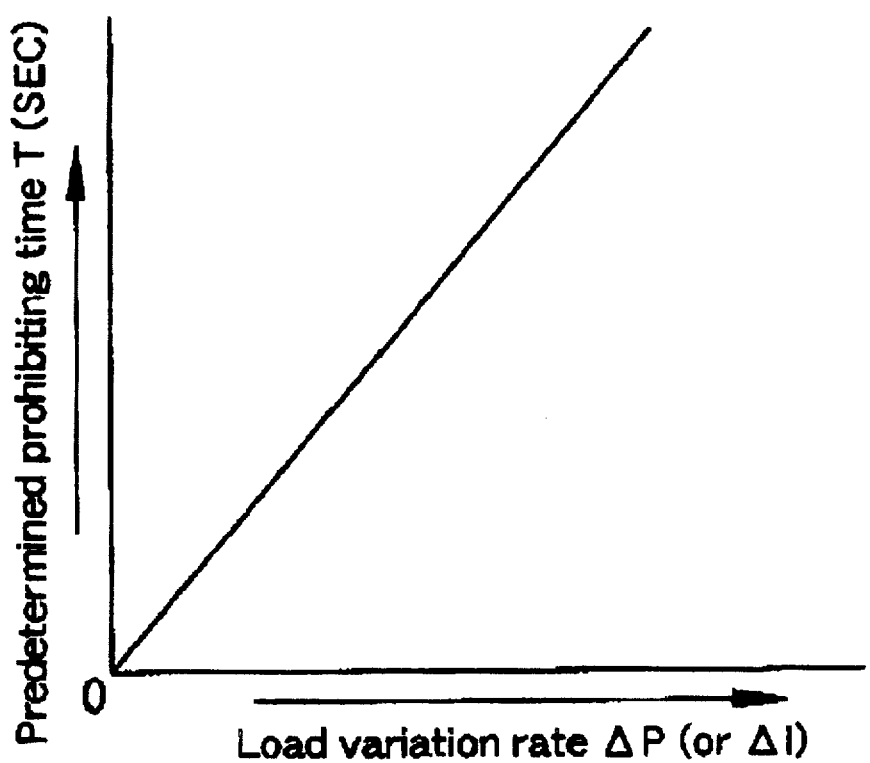
FIG. 7 is a map illustrating one example of a predetermined prohibiting time determined in accordance with the load variation rate (battery output or current variation rate)

In a case where the variation rate of the battery load is relatively large, a longer time is required until the output voltage from the battery is stabilized immediately after the load varies, as compared with a case where the variation rate of the battery load is relatively small. This also influences the variability and the accuracy. When the predetermined prohibiting time T is variably determined so that it can be varied in accordance with the battery output variation rate $\Delta P$ or current variation rate $\Delta I$ as the load variation rate (so that the predetermined prohibiting time T is prolonged, as the variation rate $\Delta P$ or $\Delta I$ increases in the illustrated example), as shown in FIG. 7, the predetermined prohibiting time T can be changed in accordance with the load variation rate, even if the time required until the output voltage E from the battery is stabilized immediately after a sudden variation in load varies in accordance with the load variation rate (the variation rate $\Delta P$ or $\Delta I$). Thus, it is possible to perform the evaluation of a remaining capacity with a high degree of accuracy without being influenced by the load variation rate.

The ability of the battery to absorb a sudden variation in load tends to decrease as the remaining capacity of the battery decreases. Therefore, when the limit level of the variation in load, which is a criterion for the judgment of whether the battery is in a sudden-load-varying state, is determined at a given level irrespective of the remaining capacity of the battery, a large number of unnecessary voltage data causing the dispersion and reduced accuracy are obtained and used for evaluating the remaining capacity of the battery in a range of a relatively small remaining capacity of the battery. On the other hand, in a range of a relatively large remaining capacity of the battery, a large number of intrinsically necessary voltage data are eliminated to perform the evaluation. This influences the dispersion and the accuracy in any case.

Figure 8:
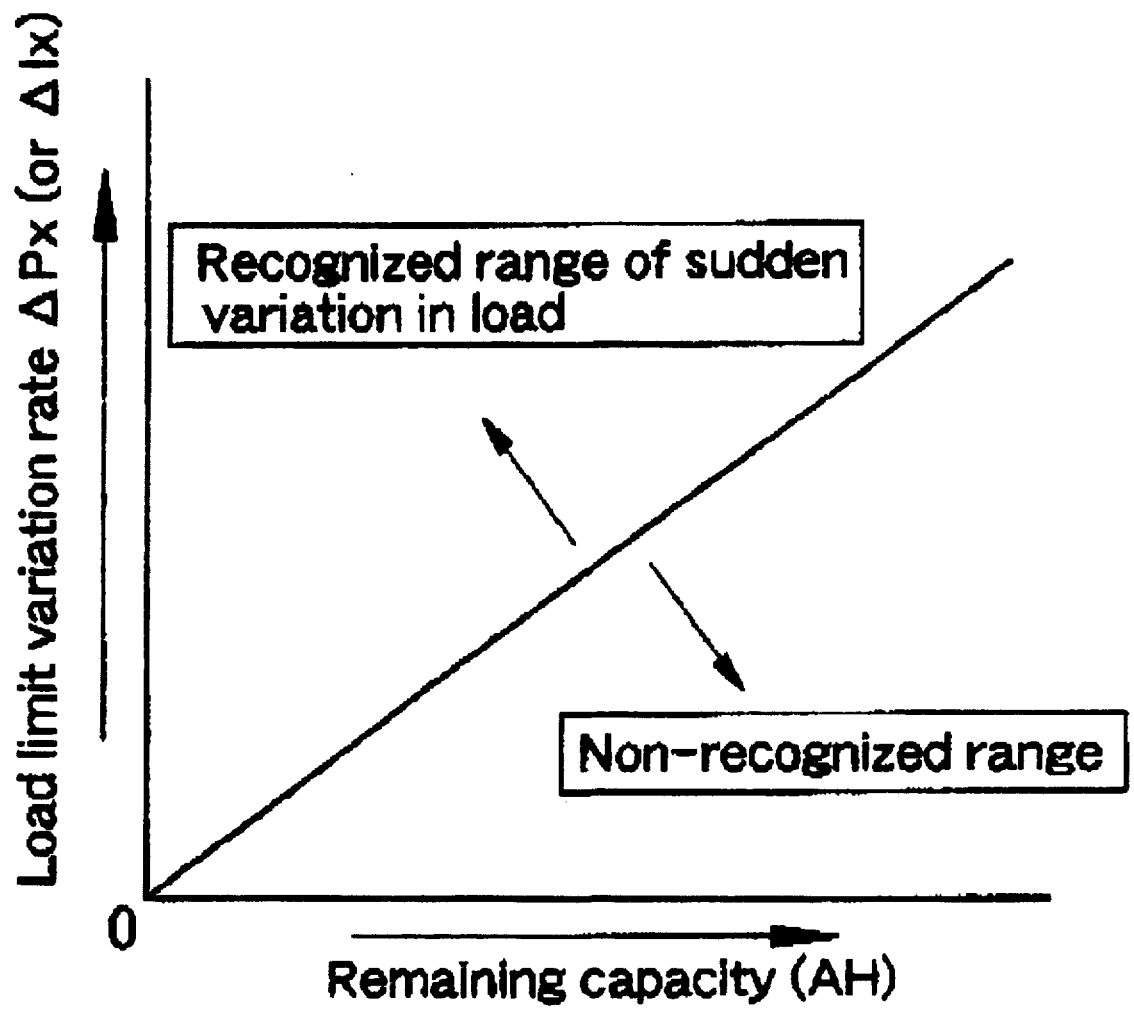
FIG. 8 is a map illustrating one example of a limit level of load (a battery output or current limit variation rate) determined in accordance with the magnitude of a remaining capacity of the battery.

Therefore, when the limit level of the variation in load, which is the criterion for the judgment of whether the battery is in a sudden-load-varying state, is determined so that it can be varied in accordance with the remaining capacity of the battery (so that the limit variation rate $\Delta P_x$ of the battery output P or the limit variation rate $\Delta I_x$ of the discharged current I serving as a limit level increases, as the remaining capacity of the battery increases in the illustrated example), as shown in FIG. 8, the limit level of the variation in load (the variation rate $\Delta P_x$ or $\Delta I_x$) can be changed depending upon the load variation absorbing ability of the battery that varies in accordance with the remaining capacity. Thus, it is possible to efficiently collect only voltage data required for the evaluation of the remaining capacity of the battery without obtaining or using unnecessary voltage data which decreases the accuracy of the evaluation of the remaining capacity.

Although the embodiment of the present invention has been described in detail, it will be understood that the present invention is not limited to the details of the above-described embodiment, and various modifications may be made without departing from the spirit and scope of the invention defined in claims. For example, the battery discharge current I or output P varying in accordance with the battery load is used as a physical quantity representing the battery load in the embodiment, but another physical quantity varying in accordance with the battery load may be used as a battery load.

What is claimed:

1. A process for evaluating a remaining capacity of a battery, comprising the steps of measuring a discharge current and an output voltage from the battery during discharging of the battery, calculating a maximum output value of the battery based on a characteristic of variation in discharge current and output voltage determined from the measured discharge current and output voltage, and evaluating a remaining capacity of the battery from the calculated maximum output value, wherein the evaluation of the remaining capacity is prohibited in a sudden-load-varying state in which a variation in load on the battery during discharging of the battery exceeds a predetermined limit level.

2. A process for evaluating a remaining capacity of a battery according to claim 1, wherein even if said sudden-load-varying state is discontinued, the evaluation of the remaining capacity is prohibited for a period until a predetermined time lapses from said sudden-load-varying state.

3. A process for evaluating a remaining capacity of a battery according to claim 2, wherein said predetermined prohibiting time is determined in accordance with a level of the battery load.

4. A process for evaluating a remaining capacity of a battery according to claim 2 or 3, wherein said predetermined prohibiting time is determined in accordance with a rate of variation in load on the battery.

5. A process for evaluating a remaining capacity of a battery according to any of claims 1, 2, and 3, wherein said limit level is determined in accordance with the remaining capacity of the battery.

6. A process for evaluating a remaining capacity of a battery according to claim 4, wherein said limit level is determined in accordance with the remaining capacity of the battery.

7. In a process for evaluating a remaining capacity of a battery, an improvement comprising the steps of detecting whether the battery is in a sudden-load-varying state, determining a level of variation of a load on the battery in said sudden-load-varying state, and prohibiting evaluation of the remaining capacity of the battery when said sudden-load-varying state has been detected and said determined level of variation in load on the battery exceeds a predetermined limit level.

8. A process for evaluating a remaining capacity of a battery according to claim 7, wherein even if said sudden-load-varying state is discontinued, the evaluation of the remaining capacity is prohibited for a period until a predetermined time lapses from said sudden-load-varying state.

9. A process for evaluating a remaining capacity of a battery according to claim 8, wherein said predetermined prohibiting time is determined in accordance with a level of the battery load.

10. A process for evaluating a remaining capacity of a battery according to claim 8 or 9, wherein said predeter mined prohibiting time is determined in accordance with a rate of variation in load on the battery.

11. A process for evaluating a remaining capacity of a battery according to any of claims 7, 8, and 9, wherein said limit level is determined in accordance with the remaining capacity of the battery.

12. A process for evaluating a remaining capacity of a battery according to claim 10, wherein said limit level is determined in accordance with the remaining capacity of the battery.

* * * * *